United States Patent
Whybrew et al.

(10) Patent No.: US 6,894,582 B2
(45) Date of Patent: May 17, 2005

(54) MICROWAVE DEVICE HAVING A SLOTTED COAXIAL CABLE-TO-MICROSTRIP CONNECTION AND RELATED METHODS

(75) Inventors: Walter M. Whybrew, Palm Bay, FL (US); Gregory H. Marquardt, West Melbourne, FL (US); Anders P. Pedersen, Palm Bay, FL (US); Jay D. Warshowsky, Melbourne Beach, FL (US)

(73) Assignee: Harris Corporation, Melbourne, FL (US)

( * ) Notice: Subject to any disclaimer, the term of this patent is extended or adjusted under 35 U.S.C. 154(b) by 170 days.

(21) Appl. No.: 10/360,330

(22) Filed: Feb. 7, 2003

(65) Prior Publication Data

US 2004/0155724 A1 Aug. 12, 2004

(51) Int. Cl.[7] .................................................. H01R 9/09
(52) U.S. Cl. ........................ 333/33; 333/260; 439/63; 439/581
(58) Field of Search ..................... 333/33, 260; 439/63, 439/581, 578

(56) References Cited

U.S. PATENT DOCUMENTS

| | | | |
|---|---|---|---|
| 4,695,810 A | 9/1987 | Heckaman et al. ............. 333/1 |
| 4,792,809 A | 12/1988 | Gilbert et al. ............... 343/770 |
| 5,478,258 A | * 12/1995 | Wang .......................... 439/581 |
| 5,486,798 A | 1/1996 | Veitschegger ............... 333/116 |
| 5,517,747 A | * 5/1996 | Pierro et al. ................... 29/600 |
| 5,886,590 A | 3/1999 | Quan et al. ..................... 333/33 |
| 6,007,347 A | * 12/1999 | Keldsen et al. ................ 439/63 |
| 6,099,322 A | 8/2000 | Beloritsky et al. ............. 439/63 |
| 6,236,287 B1 | 5/2001 | Quan et al. ..................... 333/33 |
| 6,266,015 B1 | 7/2001 | Heckaman et al. .......... 343/700 |
| 6,320,546 B1 | 11/2001 | Newton et al. ...... 343/700 MS |
| 6,324,755 B1 | 12/2001 | Borkowski et al. ............ 29/840 |
| 6,575,762 B2 | * 6/2003 | Evans .......................... 439/63 |
| 6,776,656 B2 | * 8/2004 | Lehtonen et al. ............ 439/578 |

FOREIGN PATENT DOCUMENTS

| | | | |
|---|---|---|---|
| EP | 0209156 | 1/1987 | .......... H01Q/21/06 |
| EP | 0370811 | 11/1989 | ............ H05B/6/70 |
| WO | 02/07263 | 1/2002 | .......... H01Q/21/00 |
| WO | 02/07332 | 1/2002 | |

OTHER PUBLICATIONS

Morgan, *A Millimeter–Wave Perpendicular Coax–to–Microstrip Transition*, IEEE MTT–S Intl. Microwave Symp. Digest, pp. 817–820, Seattle, WA, 2002.

Deibele, *Design, Measurement, and Procedure for Assembling SMA–96 Mil 2.33 Dielectric Constant Stripline Topologies*, RFI Technote 013.

Maury Microwave Corporation, Product Brochure, *End Launch Adapters, WR28 Waveguide to 2.92mm (K™) Connectors*, Jan. 22, 2002.

(Continued)

*Primary Examiner*—Dinh T. Le
(74) *Attorney, Agent, or Firm*—Allen, Dyer, Doppelt, Milbrath & Gilchrist, P.A.

(57) ABSTRACT

A microwave device includes a circuit board having a microstrip layer, a ground plane, and a dielectric layer therebetween. The circuit board has a shield receiving slot for longitudinally receiving the end of a shield conductor of a coaxial cable. The coaxial cable also has an inner conductor having an end that extends longitudinally outwardly from the end of the shield conductor. The microstrip layer has an inner conductor contact adjacent the shield receiving slot that connects to the end of the inner conductor. The device may include a conductive layer in the shield receiving slot to connect to the ground plane. The shield receiving slot may have a T shape and extend through the circuit board. The device may include a mounting fixture connecting an end of the shield conductor to the circuit board.

30 Claims, 6 Drawing Sheets

OTHER PUBLICATIONS

Southwest Microwave, Product Brochure, *2.40mm End Launch Assemblies to 50 Ghz*.

Southwest Microwave, *Wideband End Launch Assemblies Mount on Edge of Circuit Boards*, Microwave Products Division, 2002.

Maloratsky, *Reviewing the Basics of Microstrip Lines*, Rockwell Collins, Microwaves and RF, Mar. 2000.

Model 11755 Aluminum Crossguide Coupler, Microwave Filter Company, Inc., 1997.

Spinnaker Microwave, technical support, available at www.spinnakermicrowave.com

* cited by examiner

US 6,894,582 B2

MICROWAVE DEVICE HAVING A SLOTTED COAXIAL CABLE-TO-MICROSTRIP CONNECTION AND RELATED METHODS

FIELD OF THE INVENTION

The present invention relates to the field of electronic circuits, and, more particularly, to printed circuit boards and connections therefor.

BACKGROUND OF THE INVENTION

A circuit board comprising printed transmission lines or microstrips with associated ground planes not only provides compact and lightweight circuits, but also provides broadband frequency capabilities. This type of circuit board can be carried, for example, in a housing and is widely used, for example, as a microwave interconnect device for telecommunications and satellites. With such a microwave device, there frequently is a need to transition a coaxial cable to the microstrip to thereby launch microwave signals onto the circuit board, for example. The coaxial cable typically comprises an inner conductor and a shield conductor surrounding the inner conductor, and the transition may involve electrically connecting the inner conductor to the microstrip and connecting the shield conductor to a ground plane corresponding to the microstrip.

The ground plane is typically buried just beneath a surface of the circuit board as reference to the microstrip. Thus, a conventional approach to making the coaxial cable-to-microstrip transition, as typified by the Tri-Band Block Converter made by the assignee of the present invention, is to expose the ground plane by forming an opening in the surface of the circuit board. With the ground plane thus exposed, the shield conductor can be soldered to the ground plane. This approach may pose disadvantages, however. For example, providing an opening in the top layer of the circuit board to expose an underlying ground plane usually requires that the circuit board be constructed in multiple and cumbersome steps, which adds to the cost of manufacturing such circuit boards.

Another particularly vexing problem relates to the difficulty associated with accurately aligning the coaxial cable relative to the microstrip so that they may be properly connected, typically by soldering an end of the inner conductor to a corresponding end of the microstrip. Even when the coaxial cable is properly aligned, it still may be quite difficult to maintain the coaxial cable in position during soldering.

Despite the difficulty, it is important that the alignment of the coaxial cable and microstrip be accurately made and maintained. Otherwise, there may be considerable difference between the electrical lengths of the signal and return paths that result from the transition. Even modest differences in the signal and return paths may degrade the voltage standing wave ratio (VSWR), which, in turn, can cause amplitude ripple due to mismatching.

In recent years, several types of perpendicular coaxial cable-to-microstrip transitions have been proposed. For example, U.S. Pat. No. 5,886,590 to Quan et al. discloses an orthogonal coaxial cable-to-microstrip transition. The transition uses a compressible connector for providing a solderless contact between the inner conductor of a coaxial cable and a microstrip. U.S. Pat. No. 6,236,287 to Quann et al. similarly discloses a compressible interconnect that provides a connection between the inner conductor of a coaxial cable and a microstrip, the inner conductor and microstrip being perpendicular to one another.

Perpendicular coaxial cable-to-microstrip transitions, however, can be relatively complex and, accordingly, may be difficult to properly manufacture, thus adding to the cost of a microwave or other device requiring a circuit board with such a transition. More generally, these and other conventional coaxial cable-to-microstrip transitions may rely on a structure and/or components that extend too far off of the circuit board to achieve the narrow profile that may be needed for many applications. For these and other reasons, circuit devices relying on conventional coaxial cable-to-microstrip transitions may not be suited for certain types of applications.

SUMMARY OF THE INVENTION

With the foregoing background in mind, it therefore is an object of the present invention to provide a microwave device having a more efficient coaxial cable-to-microstrip transition or connection.

This and other objects, features, and advantages in accordance with the present invention are provided by a microwave device comprising a circuit board having a shield receiving slot therein to longitudinally receive the shield conductor of a coaxial cable. The coaxial cable may comprise an inner conductor surrounded by the shield conductor, and the circuit board may comprise a microstrip layer and a ground plane separated by at least one dielectric layer. The shield receiving slot permits ready alignment of the coaxial cable with the circuit board so that the inner conductor may more accurately and securely contact the microstrip layer while the shield conductor may more accurately and securely connect to an associated ground plane or ground planes.

By facilitating a more efficiently made and more secure connection of the coaxial cable to the circuit board, the microwave device also may achieve better performance. For example, the connection of the inner conductor to the microstrip layer and the connection of shield conductor to the ground plane provide, respectively, signal and return paths. Because of the ready alignment of the coaxial cable, these connections may not only be made more easily, but may also be made more precisely, with the result that the difference between the signal and return paths may be reduced. Accordingly, there may be less risk of VSWR degradation and associated amplitude rippling effects due to mismatching of the path lengths. Additionally, manufacturing efficiencies and associated cost savings may be obtained—especially when numerous coaxial cable-to-microstrip connections are to be made—owing to the greater accuracy and ease in aligning and maintaining the coaxial cable relative to the microstrip layer when making each connection.

More particularly, the inner conductor of the coaxial cable may have an end that extends longitudinally outwardly from an adjacent end of the shield conductor, the end of the shield conductor being the end that may be received longitudinally in the shield receiving slot. Additionally, the microstrip layer may comprise an inner conductor contact that is adjacent the shield receiving slot.

The shield receiving slot may have a T-shape. End portions of the T-shaped shield receiving slot, moreover, may be rounded so that the shield conductor may more easily be received into and secured in the shield receiving slot.

A conductive layer may be included in the shield receiving slot to connect the shield conductor therein to the ground plane associated with the microstrip. The circuit board may comprise at least one other ground layer, in which event, the shield receiving slot may extend through each ground plane so that the conductive layer electrically contacts each ground plane. Indeed, the shield receiving slot may extend fully through the circuit board.

Optionally, the microwave device may also include a mounting fixture for connecting the end of the shield conductor to the circuit board. The mounting fixture may comprise a tubular body, an enlarged diameter end flange connected to the tubular body, and a pair of mounting tabs that extend longitudinally outwardly from the end flange and connect to the circuit board. The shield receiving slot, accordingly, may have the T-shape already described and may be dimensioned to readily receive the mounting fixture. The mounting fixture may serve both to more easily align the shield conductor with the shield receiving slot, for ready positioning therein, and to hold the shield conductor more securely within the shield receiving slot once it has been positioned therein.

To also secure the coaxial cable in the shield receiving slot, the microwave device also may include a brace spaced from the mounting fixture to further secure the end of the shield conductor in the shield receiving slot. The brace may comprise a U-shaped bracket that fits over the coaxial cable and that is flanked by two tabs that connect the brace to the circuit board.

The microwave device also may include a coaxial cable connector carried by the housing. The coaxial cable connector may connect to an end of the coaxial cable opposite the end connected to the circuit board.

An additional aspect of the invention relates to a method of making a coaxial cable-to-microstrip connection on a circuit board. The method may include forming a shield receiving slot in the circuit board adjacent the inner conductor contact, forming a conductive layer in the shield receiving slot, and longitudinally positioning the end of the shield conductor in the shield receiving slot. Accordingly, the inner conductor may connect more readily and more securely to the inner conductor contact, and the shield conductor may more readily and more securely connect to the conductive layer to thereby make the coaxial cable-to-microstrip connection.

DETAILED DESCRIPTION OF THE PREFERRED EMBODIMENTS

Figure 1:
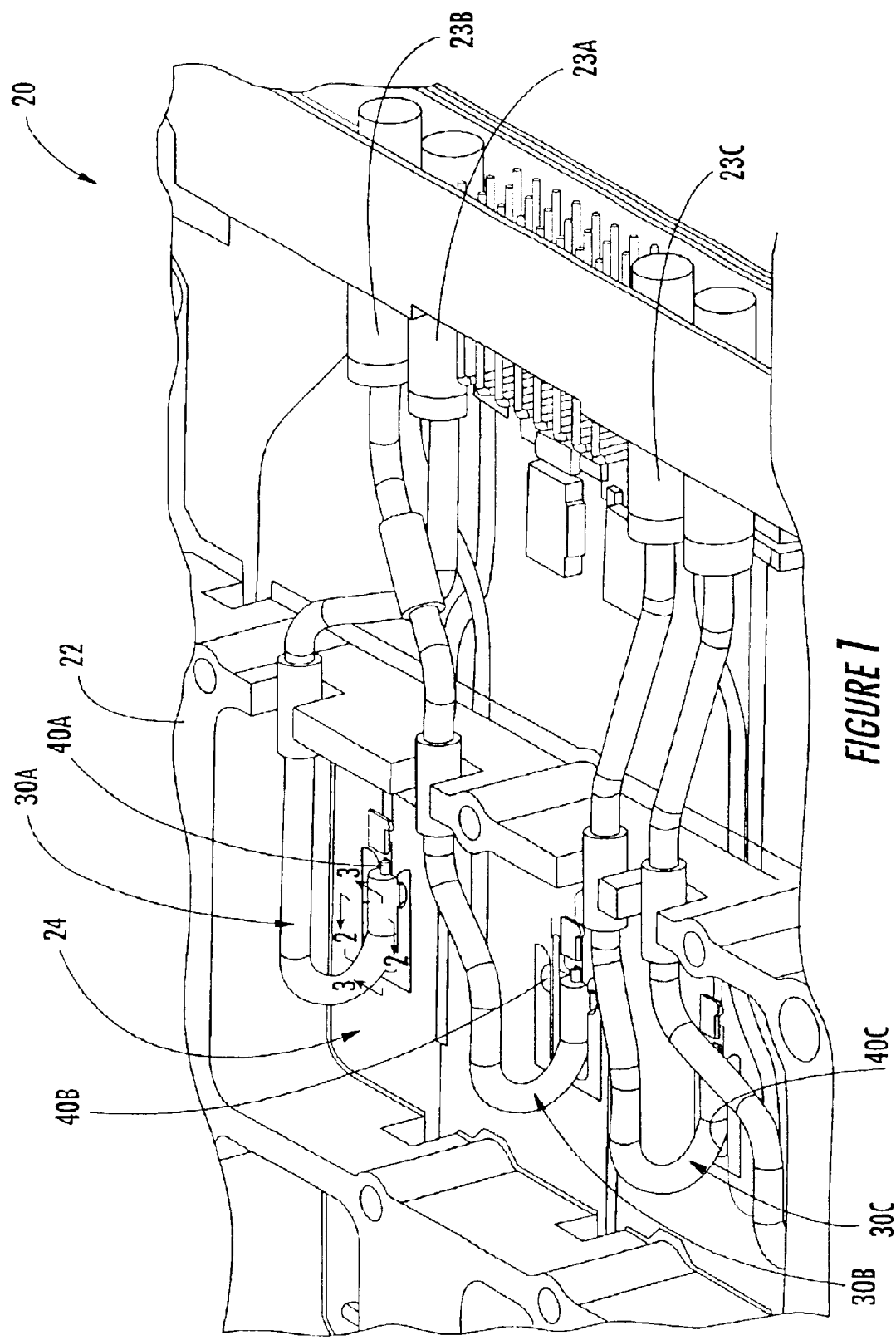
FIG. 1 is a perspective view of a portion of a microwave device according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and the prime notation indicates similar elements in alternate embodiments.

Referring initially to FIGS. 1–4, a microwave device 20 according to the present invention is now described. The microwave device 20 illustratively includes a housing 22, and a circuit board 24 carried by the housing. The circuit board 24 illustratively comprises one or more microstrip layers, of which a representative microstrip layer 26 is described herein with the understanding that the others are similar. The circuit board 24 also illustratively includes a plurality of ground planes 27, 28, 31. The microstrip layer 26 and ground planes 27, 28, 31 are illustratively separated by a plurality of dielectric layers 29A, 29B, 29C, 29D. Accordingly, it will be readily appreciated by those skilled in the art that the circuit board 24 may be a printed wiring board (PWB) comprising at least one printed transmission line (e.g., a 50-Ohm transmission line).

It will also be appreciated by those skilled in the art that, while two ground planes are illustratively shown, the circuit board 24 alternately may comprise more than two such ground planes or as few as a single ground plane associated with the microstrip layer 26. Likewise, although the circuit board 24 further illustratively includes a plurality of dielectric layers 29A, 29B, 29C, 29D separating the microstrip layer 26 and plurality of ground planes 27, 28, 31 one from one another, it will be readily appreciated by those skilled in the art that the circuit board alternately may comprise more than four such dielectric layers or as few as one dielectric layer separating a single microstrip layer and associated ground plane.

Additionally, the microwave device 20 illustratively includes a plurality of coaxial cables 30A, 30B, 30C that connect to respective microstrip layers. Again, for ease in presentation, a single coaxial cable 30A is described, it being similar to each of the others. The coaxial cable 30A comprises an inner conductor 32 and a shield conductor 34 surrounding the inner conductor. As shown, a dielectric layer 35 separates the inner conductor 32 and the shield conductor 34 from one another. The inner conductor 32 illustratively has an end 36 that extends longitudinally outwardly from an adjacent end 38 of the shield conductor 34.

For each coaxial cable 30A, 30B, 30C, there is illustratively a respective shield receiving slot 40A, 40B, 40C in the circuit board 24. A representative shield receiving slot 40A is described herein, again, with the understanding that the other shield receiving slots 40B, 40C are similar. The shield receiving slot 40A longitudinally receives an end 38 of a shield conductor 34. With the end 38 of the shield conductor 34 held in the shield receiving slot 40A, the end 36 of the inner conductor 32 of the coaxial cable 30 extends longitudinally outwardly therefrom to electrically connect with the microstrip layer 26. Illustratively, the microstrip layer 26 comprises an inner conductor contact 42 that contacts the end 36 of the inner conductor 32.

Figure 2:
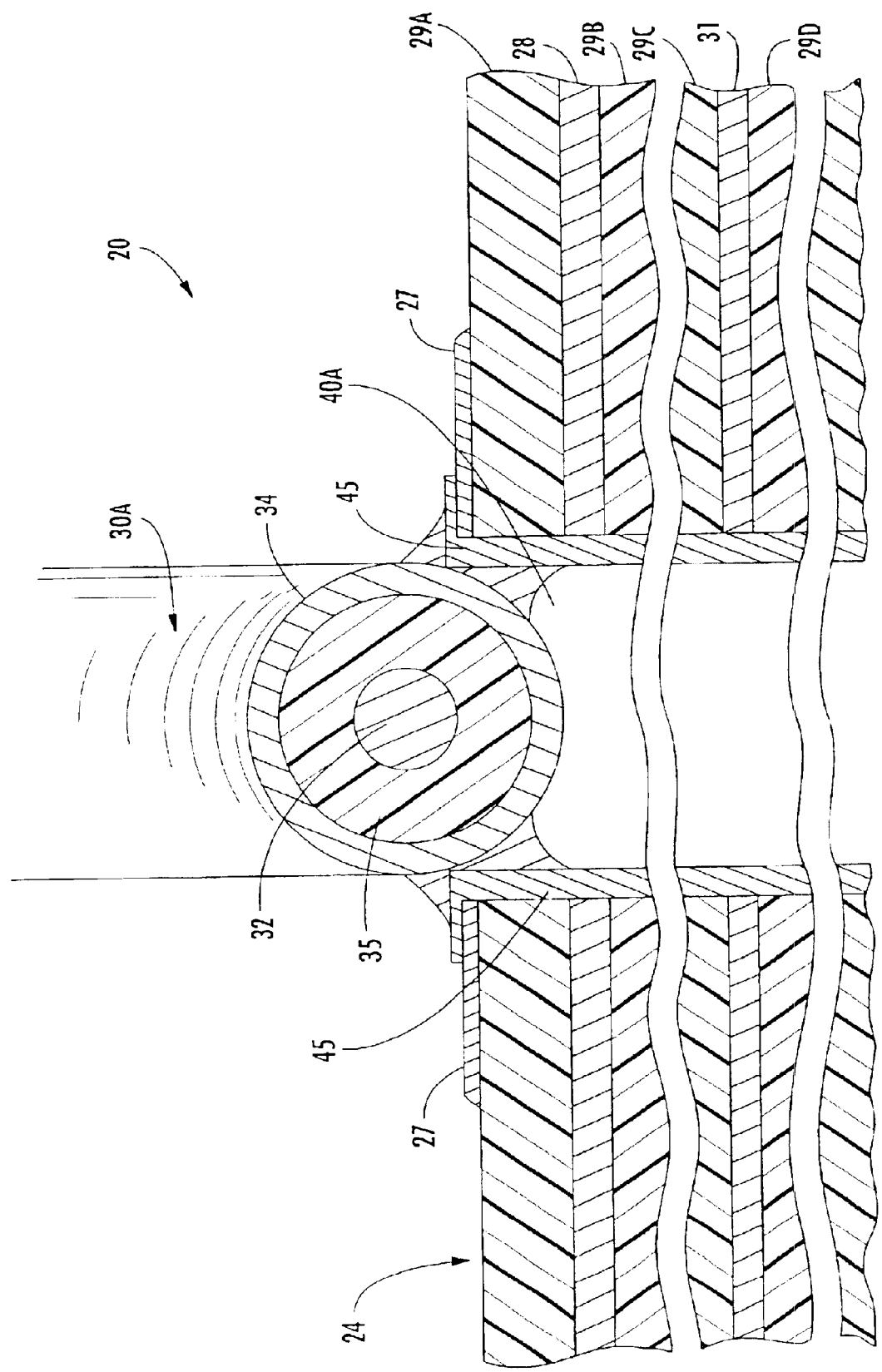
FIG. 2 is a cross-sectional view taken along line 2—2 of FIG. 1.
Figure 3:
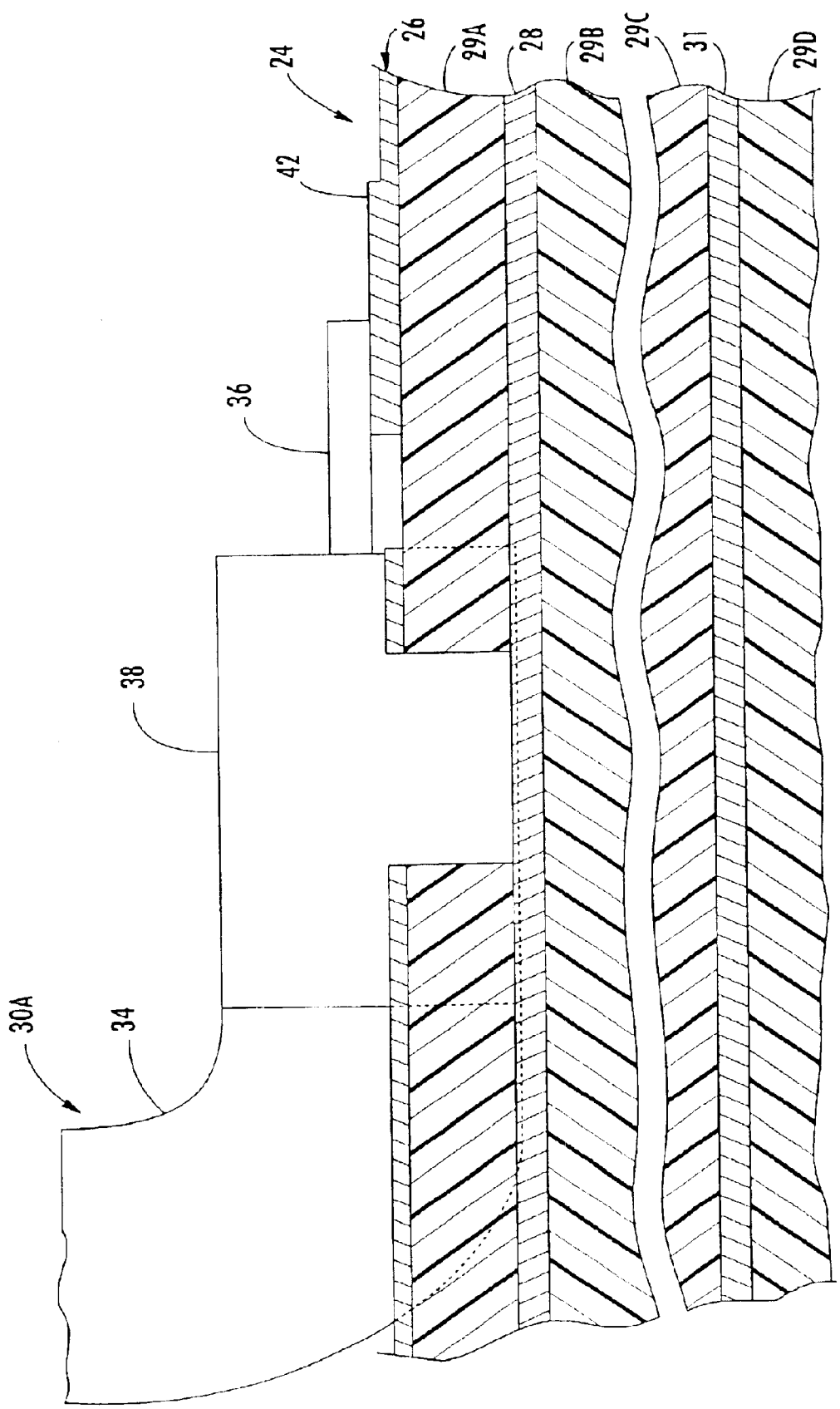
FIG. 3 is a cross-sectional view taken along line 3—3 of FIG. 1.
Figure 4:
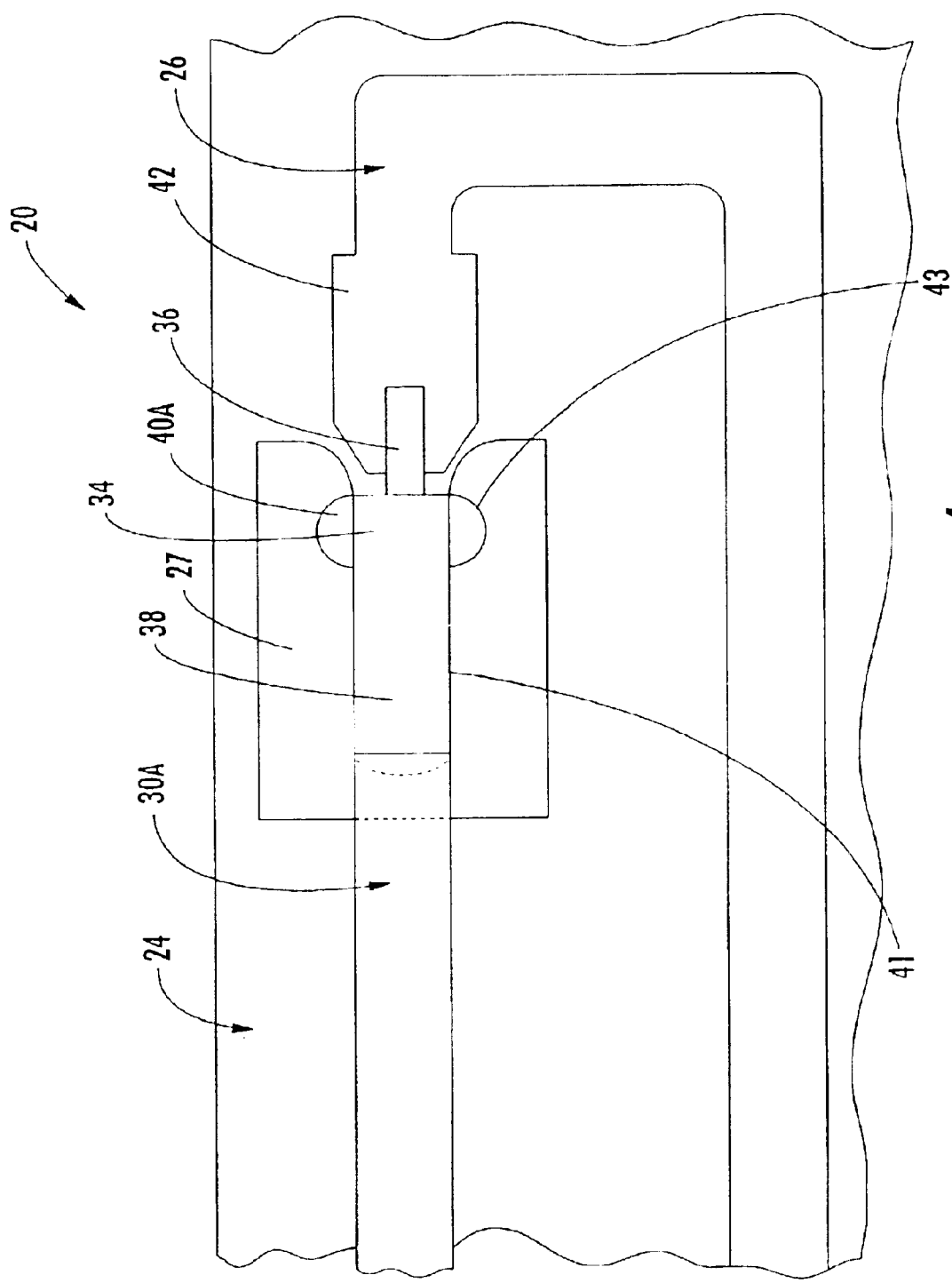
FIG. 4 is a top plan view of the circuit board of the microwave device of FIG. 1.

A conductive layer 45 illustratively extends into the shield receiving slot 40A, as perhaps best illustrated in FIG. 2. The shield conductor 34 is illustratively soldered to the conductive layer 45 within the shield receiving slot 40A and the surrounding ground plane 27. The conductive layer 45 provides an electrical connection between the shield conductor 34 and each of the ground planes 27, 28, 31. As already noted, the circuit board 24 alternately may include more than two ground planes or as few as one. Accordingly, it will also be readily understood by those skilled in the art that the conductive layer 45 within the shield receiving slot 40A may connect with one, some, or all of the ground planes.

Moreover, regardless of whether the circuit board 24 includes only a single ground plane or a plurality of ground planes, the shield receiving slot 40A may extend fully through the circuit board 24. The conductive layer 45 within the shield receiving slot 40A, accordingly, may also extend through the circuit board 24 as illustrated.

With the end 38 of the shield conductor held in securely within the shield receiving slot 40A, the end 36 of the inner conductor 32 is aligned with the inner conductor contact 42 as shown. Illustratively, the end of the inner conductor 32 is aligned to contact a top surface of the inner conductor contact 42, as perhaps best shown in FIG. 3. Alternately, though, the end 38 of the shield conductor 34 may be held within the shield receiving slot 40A so that the tip of the end of the inner conductor 32 is flush with the vertical edge of the inner conductor contact 42 closest to the shield receiving slot 40A. As will be readily appreciated by those skilled in the art, various other surface-to-surface contact alignments are possible as well, with the shield receiving slot 40A allowing the alignment to be made easily and also serving to secure the resulting connections. Solder is typically used to mechanically and electrically complete the connection between the inner conductor 32 and inner conductor contact 42, as well as the end 38 of the shield conductor 34 to the conductive layer 45 in the shield receiving slot 40A.

As will be readily understood by those skilled in the art, the inner conductor 32 provides a microwave signal path, and the shield conductor 34 provides a microwave return path. With the shield receiving slot 40A longitudinally receiving the end 38 of the shield conductor 34 so as to permit ready alignment and connection of the coaxial cable 30A with the microstrip layer 26 and ground planes 27, 28, 31, the connections may be made coincidentally or very nearly so. Accordingly, any difference between the electrical lengths of the signal and return paths may be reduced. This, in turn, may reduce degradation of the VSWR associated with the microwave device 20 and, accordingly, reduce amplitude ripple that might otherwise arise from mismatching.

The ready alignment of the coaxial cable 30A with the microstrip layer 26 and ground planes 27, 28, 31 is facilitated by the illustrated shape of the shield receiving slot 40A, as perhaps best shown in FIG. 2. More particularly, the shield receiving slot 40A comprises a first elongate portion 41 and a second elongate portion 43 extending generally perpendicularly to the first elongate portion, giving the shield receiving slot a general T-shape (the first elongate portion corresponding to the center bar of the T, and the second elongate portion corresponding to the cross bar of the T). As illustrated, the T-shaped shield receiving slot 40A further comprises rounded end portions (i.e., at the ends of the cross bar and bottom of the center bar of the T).

The ends of the second elongate portion 43, moreover, are spaced wide enough apart so that the straight-sided medial portion between the ends accommodates the radial width of the end 38 of the shield conductor 34. Because of the difficulties in machining sharp corners in a circuit board, this configuration permits efficient machining of the slot in the circuit board 24 while also permitting the end 38 of the shield conductor 34 to fit up against the straight-sided medial portion of the T-shaped shield receiving slot 40A so that it is flush or nearly so with the side of the T-shaped shield receiving slot that is closest to the microstrip layer 26. This further enhances the ready alignment both of the end 38 of the shield conductor 34 in the shield receiving slot 40A and the end 36 of the inner conductor 34 with the inner conductor contact 42. It also enhances, more generally, the structural integrity of the connection of the coaxial cable 30A to the circuit board 24.

The microwave device 20 further illustratively includes a plurality of coaxial cable connectors 23A, 23B, 23C. The coaxial cable connectors 23A, 23B, 23C are illustratively carried by the housing 22 and connecting to ends of respective coaxial cable 30A, 30B, 30C, each coaxial cable connector connecting to the end of the coaxial cable that is opposite the coaxial cable end that connects to the circuit board.

Figure 5:
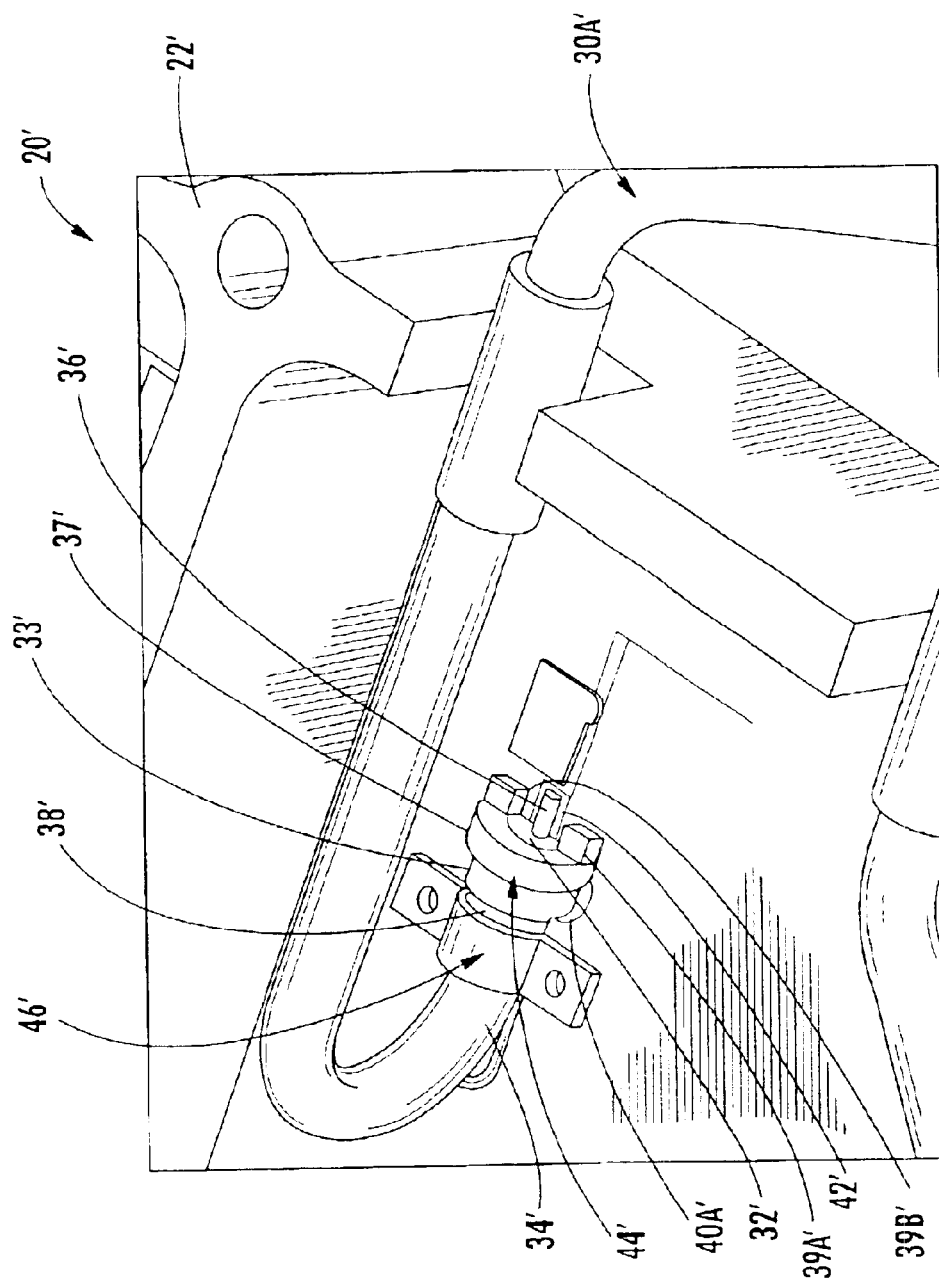
FIG. 5 is a perspective view of a portion of another microwave device including an optional mounting fixture and brace according to the present invention.

Referring additionally now to FIG. 5, the microwave device 20' may optionally include a mounting fixture 44' for the coaxial cable 30A'. Illustratively, the mounting fixture 44' comprises a tubular body 33', an enlarged diameter end flange 37', and a pair of mounting tabs 39A', 39B' extending longitudinally outwardly from the end flange. The enlarged diameter end flange 37', as shown, readily fits within the T-shaped shield receiving slot 40A' so that the mounting fixture 44' can be easily received therein. Accordingly, the mounting fixture 44' serves to further enhance the ready alignment of the shield conductor 34' in the shield receiving slot 40A' and the end 36' of the inner conductor 32' with the inner conductor contact 42'. The mounting fixture 44' also further secures the connection of the coaxial cable 30A' to the circuit board 24'.

The microwave device 20' also may optionally include a brace 46' spaced from the mounting fixture 44'. The brace 46' serves to further secure the end 38' of the shield connector 34' in the shield receiving slot 40A'. Illustratively, the brace comprises a U-shaped bracket that fits over the coaxial cable 30A' with two tabs extending from the ends of the bracket to connect to the circuit board 24' (e.g. with a threaded fastener or by soldering).

As will be readily understood by those skilled in the art, each coaxial cable 30A, 30B, 30C and the circuit board 24 may operate in various frequency ranges, and preferably in a frequency range of up to about 30 GHz. The coaxial cables 30A, 30B, 30C and circuit board 24 also may have various impedances; as will also be readily understood by those skilled in the art, with a preferred impedance for some embodiments being 50 ohms.

Figure 6:
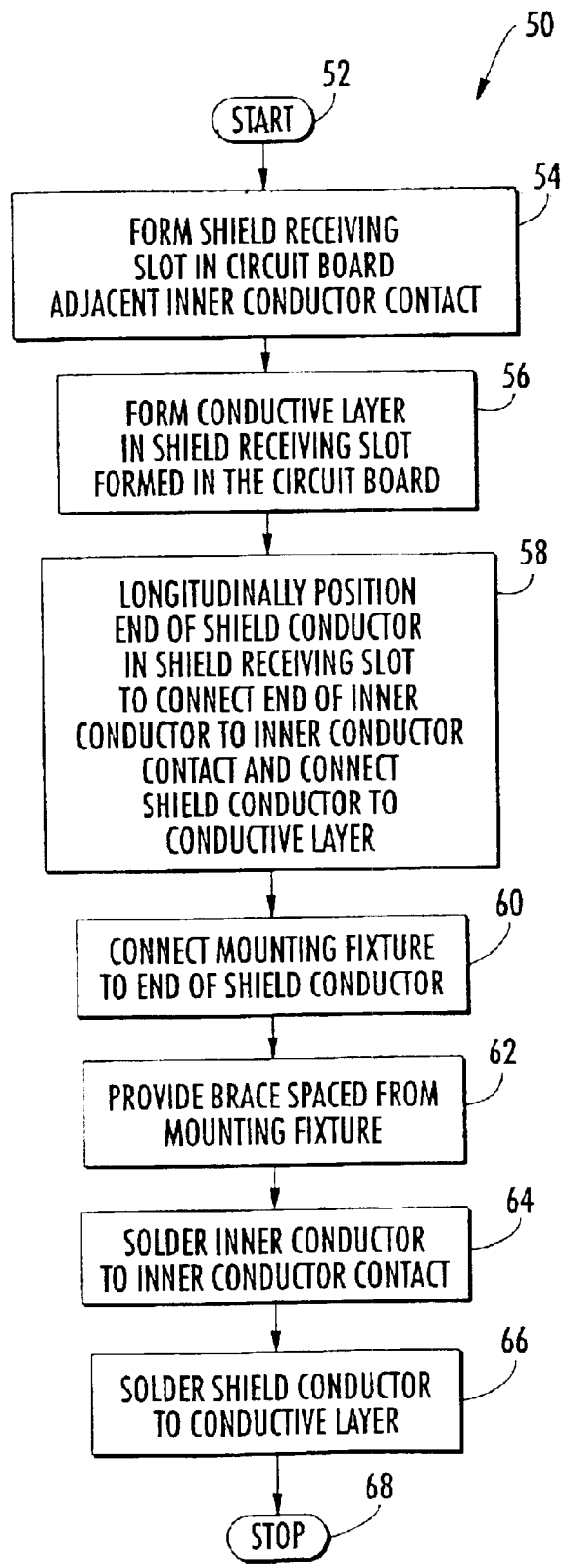
FIG. 6 is a flow chart of making a microwave device according to the present invention.

An additional aspect of the invention relates to a method of making a coaxial cable-to-microstrip connection on a circuit board 24, where the circuit board comprises a microstrip layer 26, a ground plane 28, and at least one dielectric layer 29A, 29B, 29C, 29D therebetween, where the microstrip layer comprises an inner conductor contact 42, where the coaxial cable comprises an inner conductor 32 and a shield conductor 34 surrounding the inner conductor, and where the inner conductor has an end 36 extending longitudinally outwardly from an adjacent end 38 of the shield conductor. The method is illustrated by the flow chart 50 of FIG. 6.

The method illustratively includes, after the start at Block 52, forming a shield receiving slot 40A in the circuit board 24 adjacent the inner conductor contact 42 (Block 54). At Block 56, the method further illustratively includes forming a conductive layer 45 in the shield receiving slot 40A, and, at Block 58, longitudinally positioning the end 38 of the shield conductor 34 in the shield receiving slot 40A. With the end of the shield conductor so positioned in the shield receiving slot 40A, the end 36 of the inner conductor 32 connects to the inner conductor contact 42 and the shield conductor 34 connects to the conductive layer 45 to thereby make the coaxial cable-to-microstrip connection.

Forming the shield receiving slot 40A (Block 54) illustratively comprises forming the shield receiving slot to have a T shape. Illustratively, forming the shield receiving slot 40A (Block 54) further comprises forming the shield receiving slot so that the shield receiving slot has rounded end portions. Additionally, the method illustratively includes forming the shield receiving slot 40A to extend fully through the circuit board. Accordingly, the shield receiving slot 40A illustratively extends through each ground plane layer so that the conductive layer 45 therein electrically contacts each ground plane.

The method illustratively further comprises, at Block 60, connecting a mounting fixture 44 to the end 38 of the shield conductor 34. The mounting fixture 44 may comprise a tubular body 33, an enlarged diameter end flange connected to the tubular body 37, and a pair of mounting tabs 39A, 39B extending longitudinally outwardly from the end flange to contact the circuit board 24.

At Block 62, the method also illustratively comprises providing a brace 46 spaced from the mounting fixture for further securing the end 38 of the shield connector 34 in the shield receiving slot 40A. The method illustratively includes, at Block 64, soldering the inner conductor 32 with the inner conductor contact 42, and, at Block 66, soldering the shield conductor 34 to the conductive layer 45. The method concludes at Block 68.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and other embodiments are intended to be included within the scope of the appended claims.

What is claimed is:

1. A microwave device comprising:
   a circuit board comprising a microstrip layer, a ground plane, and at least one dielectric layer therebetween;
   a coaxial cable comprising an inner conductor and a shield conductor surrounding said inner conductor, said inner conductor having an end extending longitudinally outwardly from an adjacent end of said shield conductor;
   said circuit board having a T-shaped shield receiving slot therein longitudinally receiving the end of said shield conductor and a transverse portion;
   said microstrip layer comprising an inner conductor contact adjacent said T-shaped shield receiving slot and connected to the end of said inner conductor;
   a conductive layer in said T-shaped shield receiving slot and connecting said shield conductor to said ground plane; and
   a mounting fixture in the T-shaped shield receiving slot and connecting the end of said shield conductor to said circuit board, said mounting fixture comprising
      a tubular body,
      an enlarged diameter end flange connected to said tubular body, and
      at least one mounting tab extending longitudinally outwardly from said end flange and contacting said circuit board.

2. A microwave device according to claim 1 wherein said T-shaped shield receiving slot comprises rounded end portions.

3. A microwave device according to claim 1 wherein said T-shaped shield receiving slot extends fully through said circuit board.

4. A microwave device according to claim 1 wherein the end of said shield conductor is received in said T-shaped shield receiving slot so that the end of said inner conductor is aligned with said inner conductor contact.

5. A microwave device according to claim 1 further comprising a brace spaced from said mounting fixture for further securing the end of said shield connector in said T-shaped shield receiving slot.

6. A microwave device according to claim 1 wherein said circuit board further comprises at least one other ground plane; and wherein said T-shaped shield receiving slot extends through each ground plane so that said conductive layer electrically contacts each ground plane.

7. A microwave device according to claim 1 further comprising a coaxial cable connector carried by connected to an end of said coaxial cable opposite the end connected to said circuit board.

8. A microwave device according to claim 1 wherein said coaxial cable and said circuit board operate in a frequency range of up to about 30 GHz.

9. A microwave device according to claim 1 wherein said coaxial cable and said circuit board have an impedance of about 50 ohms.

10. A microwave device according to claim 1 wherein said at least one mounting tab comprises a pair thereof.

11. A microwave device comprising:
    a housing;
    a circuit board within said housing and comprising a microstrip layer, a ground plane, and at least one dielectric layer therebetween;
    a coaxial cable comprising an inner conductor and a shield conductor surrounding said inner conductor, said inner conductor having an end extending longitudinally outwardly from an adjacent end of said shield conductor;
    said circuit board having a T-shaped shield receiving slot therein longitudinally receiving the end of said shield conductor;
    said microstrip layer comprising an inner conductor contact adjacent said T-shaped shield receiving slot and connected to the end of said inner conductor;
    a mounting fixture mounting the end of said shield conductor in said T-shaped shield receiving slot so that the end of said inner conductor is aligned with said inner conductor contact, said mounting fixture comprising
       a tubular body,
       an enlarged diameter end flange connected to said tubular body, and
       at least on mounting tab extending longitudinally outwardly from said end flange and contacting said circuit board.

12. A microwave device according to claim 11 wherein said T-shaped shield receiving slot comprises rounded end portions.

13. A microwave device according to claim 11 wherein said T-shaped shield receiving slot extends fully through said circuit board.

14. A microwave device according to claim 11 further comprising a brace spaced from said mounting fixture for further securing the end of said shield connector in said T-shaped shield receiving slot.

15. A microwave device according to claim 11 further comprising a conductive layer in said T-shaped shield receiving slot and connecting said shield conductor to said ground plane.

16. A microwave device according to claim 15 wherein said circuit board further comprises at least one other ground plane; and wherein said T-shaped shield receiving slot extends through each ground plane so that said conductive layer electrically contacts each ground plane.

17. A microwave device according to claim 11 wherein said at least one mounting tab comprises a pair thereof.

18. A microwave device comprising:

a housing;

a circuit board within said housing and comprising a microstrip layer, a ground plane, and at least one dielectric layer therebetween;

a coaxial cable comprising an inner conductor and a shield conductor surrounding said inner conductor, said inner conductor having an end extending longitudinally outwardly from an adjacent end of said shield conductor;

said circuit board having a T-shaped shield receiving slot therein longitudinally receiving the end of said shield conductor, the T-shaped shield receiving slot extending fully through said circuit board;

said microstrip layer comprising an inner conductor contact adjacent said T-shaped shield receiving slot and connected to the end of said inner conductor;

a mounting fixture mounting the end or said shield conductor in the T-shaped shield receiving slot, said mounting fixture comprising a tubular body, an enlarged diameter end flange connected to said tubular body, and at least one mounting tab extending longitudinally outwardly from said end flange and contacting said circuit board; and a brace spaced from said mounting fixture for further securing the end of said shield connector in said T-shaped shield receiving slot.

19. A microwave device according to claim 18 wherein said T-shaped shield receiving slot has rounded end portions.

20. A microwave device according to claim 18 wherein the end of said shield conductor is received in said T-shaped shield receiving slot so that the end of said inner conductor is aligned with said inner conductor contact.

21. A microwave device according to claim 18 further comprising a conductive layer in said T-shaped shield receiving slot.

22. A microwave device according to claim 21 wherein said circuit board further comprises at least one other ground plane; and wherein said shield T-shaped receiving slot extends through each ground plane so that said conductive layer electrically contacts each ground plane.

23. A microwave device according to claim 18 wherein said at least one mounting tab comprises a pair thereof.

24. A method of making a coaxial cable-to-microstrip connection on a circuit board comprising a microstrip layer, a ground plane, and at least one dielectric layer therebetween, the microstrip layer comprising an inner conductor contact, the coaxial cable comprising an inner conductor and a shield conductor surrounding the inner conductor, and the inner conductor having an end extending longitudinally outwardly from an adjacent end of the shield conductor, the method comprising:

forming a T-shaped shield receiving slot in the circuit board adjacent the inner conductor contact;

forming a conductive layer in the T-shaped shield receiving slot;

connecting a mounting fixture to the end of the shield conductor, the mounting fixture comprising a tubular body, an enlarged diameter end flange connected to the tubular body, and a pair of mounting tabs extending longitudinally outwardly from the end flange; and positioning the mounting fixture in the T-shaped shield receiving slot to connect the end of the inner conductor to the inner conductor contact and to connect the shield conductor to the conductive layer to thereby make the coaxial cable-to-microstrip connection.

25. A method according to claim 24 wherein forming the T-shaped shield receiving slot comprises forming the shield receiving slot to have rounded end portions.

26. A method according to claim 24 wherein forming the T-shaped shield receiving slot comprises extending the T-shaped shield receiving slot completely through the circuit board.

27. A method according to claim 24 wherein end of the inner conductor is aligned with the inner conductor contact.

28. A method according to claim 24 further comprising providing a brace spaced from the mounting fixture for further securing the end of the shield connector in the T-shaped shield receiving slot.

29. A method according to claim 24 wherein the circuit board further comprises at least one other ground plane; and wherein forming the T-shaped shield receiving slot in the circuit comprises extending the T-shaped shield receiving slot through each ground plane layer so that the conductive layer electrically contacts each ground plane layer.

30. A method according to claim 24 wherein said at least one mounting tab comprises a pair thereof.

* * * * *